United States Patent [19]

Streit et al.

[11] Patent Number: 5,668,387
[45] Date of Patent: Sep. 16, 1997

[54] RELAXED CHANNEL HIGH ELECTRON MOBILITY TRANSISTOR

[75] Inventors: Dwight C. Streit, Seal Beach; Thomas R. Block, Los Angeles, both of Calif.

[73] Assignee: TRW Inc., Redondo Beach, Calif.

[21] Appl. No.: 548,715

[22] Filed: Oct. 26, 1995

[51] Int. Cl.$^6$ .................................................. H01L 31/0328
[52] U.S. Cl. .................... 257/192; 257/194; 257/201; 257/615; 438/168; 438/172
[58] Field of Search .................................. 257/192, 194, 257/201, 280, 613, 615; 437/107, 126, 133

[56] References Cited

U.S. PATENT DOCUMENTS

| | | | |
|---|---|---|---|
| 5,038,187 | 8/1991 | Zhou | 357/22 |
| 5,060,030 | 10/1991 | Hoke | 357/22 |
| 5,091,759 | 2/1992 | Shih et al. | 357/22 |
| 5,140,386 | 8/1992 | Huang et al. | 357/22 |
| 5,262,660 | 11/1993 | Streit et al. | 257/194 |
| 5,285,087 | 2/1994 | Narita et al. | 257/192 |
| 5,367,182 | 11/1994 | Matsugatani et al. | 257/190 |
| 5,373,168 | 12/1994 | Ando et al. | 257/24 |
| 5,393,990 | 2/1995 | Kohn | 257/12 |
| 5,406,099 | 4/1995 | Hiramatsu | 257/194 |
| 5,420,442 | 5/1995 | Hasenberg et al. | 257/22 |

OTHER PUBLICATIONS

Streit, Dwight C., "GaAs and InP selective molecular-beam epitaxy," *J. Vac. Sci. Technol.*, B 13(2) Mar. 1995.

*Primary Examiner*—Mark V. Prenty
*Attorney, Agent, or Firm*—Michael S. Yatsko

[57] ABSTRACT

A pseudomorphic HEMT having a partially relaxed InGaAs channel layer. In order to increase device performance and lower the electron transport energy levels within the potential well defined by the conduction band of the channel layer, the channel layer thickness is increased beyond a critical thickness that defines where a strained InGaAs channel becomes relaxed and forms crystal lattice dislocations. The channel layer is partially relaxed in that the channel layer thickness exceeds the critical thickness, but the thickness of the channel layer is limited so that dislocations only form in a single direction.

15 Claims, 1 Drawing Sheet

RELAXED CHANNEL HIGH ELECTRON MOBILITY TRANSISTOR

BACKGROUND OF THE INVENTION

1. Field Of The Invention

This invention relates generally to a high electron mobility transistor and, more particularly, to a pseudomorphic high electron mobility transistor incorporating a partially relaxed InGaAs channel having a thickness greater than the critical thickness.

2. Discussion of the Related Art

High electron mobility transistors (HEMTs), well known in the art, are used in various low-noise and power microwave applications where relatively high device output power, power added efficiency and noise performance are critical. Specific applications for HEMTs include Q, V and W band microwave power amplifiers for use in commercial and military radar systems, communication systems, etc. HEMTs can be effectively integrated into monolithic microwave integrated circuits and monolithic millimeter-wave integrated circuits (MMICs) including phased arrays for radiating at high power levels.

HEMTs are generally one of two types. These two types include regular HEMTs and pseudomorphic HEMTs. Both types include a drain terminal, a source terminal and a gate terminal in which a voltage potential is applied to the gate terminal in order to control the electron flow within an undoped conductive channel layer between the source terminal and the drain terminal, in a manner that is well understood in the art. The conductive channel layer creates a potential well as a result of the disparities between the conduction band of the channel layer and the conduction band of the layers surrounding the channel layer. The difference between the regular HEMT and the pseudomorphic HEMT is that the pseudomorphic HEMT has a heterojunction in which the channel layer includes different semiconductor materials where the lattice constant of one semiconductor material is significantly different than the lattice constant of other semiconductor materials in the layer.

Current pseudomorphic HEMTs are generally aluminum gallium arsenide/indium gallium arsenide (AlGaAs/InGaAs) heterojunction devices that include a strained InGaAs channel that achieve improved device performance over regular HEMTs. High device performance allows the HEMT to handle larger amounts of current flow, and thus, higher power at higher frequencies. For an HEMT of this type, the lattice constants between the indium and the gallium arsenide is significantly different because the indium atoms are larger than the gallium and arsenide atoms. During crystalline fabrication of the device, the larger indium atoms create stresses in the crystalline structure which produce a strain in the channel layer. The thicker the channel layer, or the greater the concentration of indium atoms in the channel layer, the greater the strain. When the thickness of the channel layer reaches a "critical thickness" at a particular indium concentration, the strain in the channel layer becomes large enough that the channel layer relaxes (relieves stress), and dislocations in the channel layer are formed. These dislocations create faults in the crystalline lattice of the channel layer that have been known to affect device performance. Therefore, this built-in strain has been known to limit the usable width of the InGaAs channel layer to widths below the "critical thickness" to prevent strain relaxation that form dislocations.

The maximum width of the InGaAs channel layer in prior art pseudomorphic HEMT devices has been typically less than 150 Å. A channel layer width this narrow has resulted in confined energy levels for electron transport that are relatively far from the bottom of the conduction band within the potential well formed by the InGaAs channel layer. This results in electron transport between the source terminal and the drain terminal at energy levels close to the top of the well formed in the channel layer. These high electron transport energy levels result in degradation of the confining properties of the conduction band at the channel edges causing electrons to scatter out of the channel layer. As electrons are scattered to higher energy levels during operation of the HEMT at high bias, the probability of the electrons being scattered into surrounding layers defining the InGaAs channel increases. The resulting electron transport in the surrounding layers outside of the InGaAs channel layer yields parallel transport paths that degrade device performance as a result of lower efficiency, lower transconductance, and lower overall RF performance. This is particularly true for high power devices with a high electron concentration in the InGaAs channel layer.

U.S. Pat. No. 5,060,030 issued to Hoke, Oct. 22, 1991, provides a detailed background discussion of the creation and effect of a strained InGaAs channel layer in a pseudomorphic HEMT. Hoke realizes and discusses the need to maintain the thickness of the strained channel layer below the "critical thickness". Hoke attempts to increase the channel thickness so as to increase the device performance without exceeding the critical thickness of the channel layer. To accomplish this, Hoke proposes providing a strained compensation layer made of a material, for example, boron gallium arsenide, to alleviate at least some of the strain in the channel layer so as to increase its critical thickness. As discussed in Hoke, the strain compensation layer increases the critical thickness of the channel layer by providing an intrinsic compressive stress which compensates for the intrinsic tensile stress of the channel layer.

Hoke offers one solution to increase the thickness of the InGaAs channel layer in a pseudomorphic HEMT device. However, the Hoke solution requires the incorporation of an additional layer, the strain compensation layer, that adds to device complexity and fabrication complexity. Further, the Hoke solution does not provide increase device performance at known channel layer thicknesses.

What is needed is a pseudomorphic HEMT having an InGaAs channel layer that has a thickness greater than the critical thickness of known strained HEMTs so as to lower the confining energy levels in the channel layer, without degrading the HEMT performance. It is therefore an object of the present invention to provide such an HEMT.

SUMMARY OF THE INVENTION

In accordance with the teachings of the present invention, a pseudomorphic HEMT having a partially relaxed InGaAs channel layer is disclosed where the thickness of the InGaAs channel layer is greater than the critical thickness of known strained InGaAs channel HEMTs. The partially relaxed channel allows for dislocations to form in one direction within the channel layer. The increased thickness of the channel layer allows electron transport at energy levels within the potential well formed by the channel layer to be relatively low within the well. Because the electrons travel at low energies within the well, the probability of the electrons on the channel layer being scattered into the surrounding buffer or donor layers is reduced. In one embodiment, the thickness of the InGaAs channel layer is between 150 Å and 200 Å.

Additional objects, advantages, and features of the present invention will become apparent from the following description and appended claims, taken in conjunction with the accompanying drawings.

DETAILED DESCRIPTION OF THE PREFERRED EMBODIMENTS

The following description of the preferred embodiments directed to a high electron mobility transistor including a partially relaxed channel layer that has a thickness greater than the critical thickness is merely exemplary in nature and is in no way intended to limit the invention or its application for uses.

Figure 1:
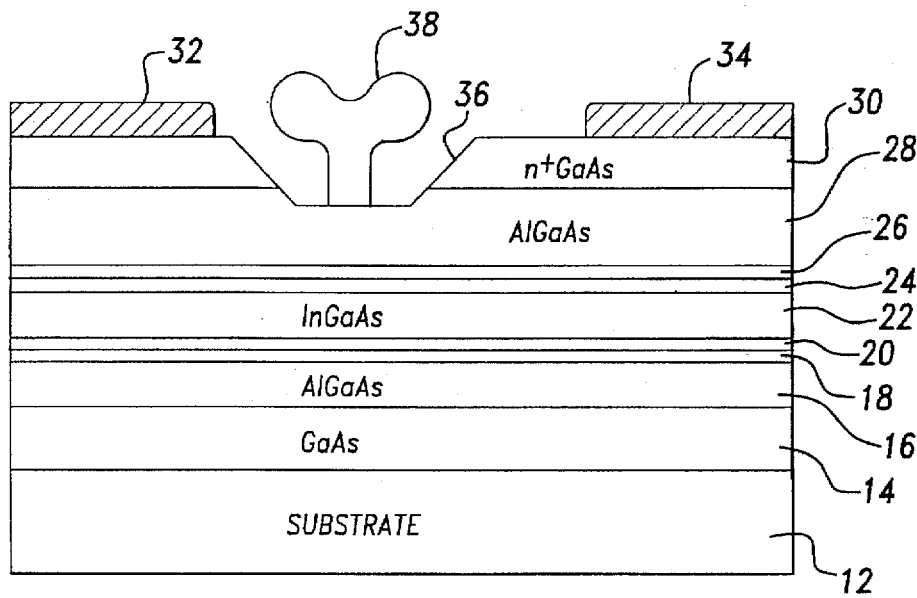
FIG. 1 is a profile view of a high electron mobility transistor including a relaxed InGaAs channel layer according to an embodiment of the present invention.

FIG. 1 shows a profile view of a high electron mobility transistor (HEMT) 10 according to an embodiment of the present invention. The HEMT 10 includes a substrate 12 on which is formed the remaining device layers. In one embodiment, the substrate 12 is a GaAs substrate, however, other suitable HEMT substrates, such as InP HEMT substrates, may also be applicable. The discussion below of the remaining device layers will be described as if they are deposited on the substrate 12 by molecular beam epitaxial (MBE) to form the semiconductor crystalline structure. Molecular beam epitaxy is a well understood semiconductor layer deposition process by which desirable semiconductor constituent materials are heated to a gaseous state in a vacuum chamber so that constituent atoms are uniformly deposited over already existing layers. It will be appreciated by those skilled in the art, however, that other methods of semiconductor formation may also be applicable.

A uniform GaAs buffer layer 14 is deposited on the substrate 12 to a thickness of about 3000 Å. A uniform AlGaAs buffer layer 16 is deposited on the buffer layer 14 to a thickness of approximately 200–300 Å. Next, a planar doped layer 18 consisting of silicon dopant atoms is deposited on the AlGaAs buffer layer 16 to a thickness of approximately 20 Å, and an AlGaAs spacer layer 20 is deposited on the planar doped layer 18 to a thickness of approximately 20 Å.

A partially relaxed InGaAs conductive channel layer 22 is deposited on the spacer layer 20. In one embodiment, the layer 22 has a thickness between 150–200 Å based on a percentage of indium in the layer 22 below 30%. Specific applicable percentages of indium include 20%, 22% and 28%. As the percentage of indium in the layer 22 increases, the critical thickness of the channel layer 22 decreases. As will be discussed in further detail below, the InGaAs channel layer 22 is a partially relaxed channel layer having a thickness greater than the critical thickness so as to lower the electron transport energy levels in the channel layer 22 to provide increased electron transport efficiency, without degrading the device performance. What is meant by partially relaxed is that the channel layer thickness is allowed to increase beyond the critical thickness until the stress in the channel layer 22 created by the larger indium atoms relaxes and creates dislocations in a single direction. The thickness of the channel layer 22 above the critical thickness is controlled so as to only allow dislocations to form in that direction. If the channel layer 22 has a thickness just above the critical thickness, then dislocations will begin to form in one direction. If the thickness of the channel layer 22 is increased beyond a second critical thickness, dislocations will begin to form in more than one direction causing a serious degradation in device performance.

An AlGaAs spacer layer 24 and a planar doped layer 26 of silicon dopant atoms are deposited on the channel layer 22 such that a symmetrical configuration of the layers 18, 20, 24 and 26 define the channel layer 22. An AlGaAs donor layer 28 is then deposited on the planar layer 26 to a thickness of approximately 300 Å. An N-doped GaAs contact layer 30 is then deposited on the AlGaAs donor layer 28 to a thickness of approximately 200 Å.

Once the above-described layers are deposited, contact terminals are then formed. An appropriate metal contact material is deposited over the contact layer 30 and etched to form a source terminal 32 and a drain terminal 34, as shown. The exposed contact layer 30 is then etched to form a recessed region 36, such that a T-gate terminal 38 can be formed in contact with the AlGaAs donor layer 28 as shown. Each of the fabrication steps necessary to provide the above described layers, as well as the contact terminals, are well understood in the art.

The conduction band configuration between the donor layer 28, the channel layer 22, and the buffer layer 16 enable electrons to be trapped with the channel layer 22. The planar doped layers 18 and 26 provide electrons to be emitted into the channel layer 22 for transport. The spacer layers 20 and 24 prevent the donor silicon atoms in the doped layers 18 and 26 from entering the channel layer 22 under no electrical voltage potential. A voltage potential applied at the drain terminal 34 will cause the electrons to flow from the source terminal 32 to the drain terminal 34 through the channel layer 22. A voltage applied at the gate terminal 38 will modulate the conductivity of the channel layer 22. A positive gate terminal voltage increases the conductivity while a negative gate terminal voltage decreases the conductivity of the channel layer 22. This conductivity modulation provides control of the current flowing through the channel layer 22. Contact layer 30 provides good ohmic contact between the channel layer 22 and the terminal 32 and 34. The buffer layer 14 prevents diffusion of defects and impurities from the substrate 12 into the channel layer 22.

The structure of the HEMT 10 shown in FIG. 1 is one specific implementation utilizing the partially relaxed channel layer 22 of the invention. The other layers, and their particular thicknesses and doping, are intended solely to represent one way of developing an HEMT. Other HEMT profiles and structures including different layers, additional layers, less layers, or other materials, that utilize a partially relaxed channel layer would be within the scope of the present invention.

Figure 2:
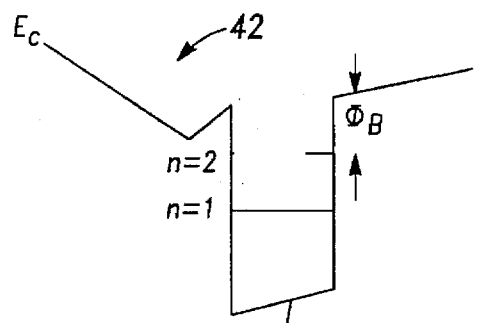
FIG. 2 is an energy band diagram of the conduction band of an InGaAs channel layer of a prior art HEMT.

The partially relaxed channel layer 22 has an increased thickness, greater than the critical thickness, of known prior art strained InGaAs channel layers of known HEMTs. As mentioned above, this increased channel thickness provides lower electron transport levels through the channel layer 22 than could be achieved by the prior art strained InGaAs channels. To illustrate this difference, FIG. 2 shows a prior art conduction band energy diagram 42 showing a channel layer potential well 44 defined by an InGaAs channel layer and surrounding buffer and donor layers. As is apparent from viewing this diagram, two energy levels at n=1 and n=2 are created that allow electrons to travel through the well 44. The highest electron transport energy level is at n=2 towards the top of the well 44 at a distance defined by energy $\Phi_B$ from the top of the conduction band of the surrounding layers.

Figure 3:
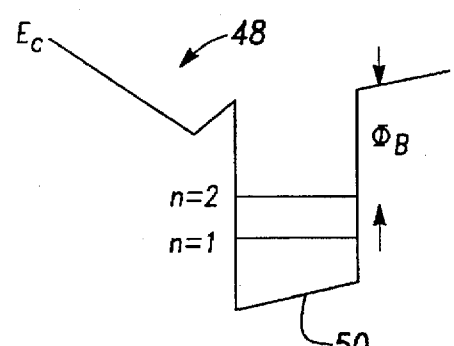
FIG. 3 is an energy band diagram of the conduction band of the relaxed InGaAs channel layer of the HEMT of FIG. 1.

FIG. 3 shows a conduction band energy diagram 48 of the conduction band at the InGaAs channel layer 22 and the surrounding layers 18, 20, 24 and 26 that define a channel layer potential well 50. Because the channel layer 22 has a greater thickness than the channel layer that created the well 44 in the prior art, the energy transport levels at n=1 and n=2 of the energy diagram 48 are lower within the well 50 than those in the well 44. Therefore, the energy difference $\Phi_B$ between the top of the conduction band and the highest energy transport level at n=2 is greater than that for the well 44 as indicated in FIG. 3. Of course, different channel layer thicknesses would provide different energies $\Phi_B$. The lower energy transport levels at n=1 and n=2 act to significantly prevent electrons travelling in the channel layer 22 from scattering out of the well 50, and not adding to the electron transport of the device, especially at high power. Therefore, the performance of the HEMT 10 increases.

The partially relaxed channel layer 22 should, according to the known art, be of a lower performance than the channel layer that created the well 44 due to scattering from the dislocations formed by the relaxation process. However, it has been found that there is a region of operation where the channel layer is only partially relaxed, and provides improved device performance compared to fully strained channels. Increasing the well width beyond the normal critical thickness improves device performance by lowering the electron energy transport levels in the channel potential well 50, as discussed above. This energy is approximately proportional to $1/L^2$, where L is the well thickness. This increased channel thickness lowers the confined energy levels at n=1 and n=2 to about half of their original value. This in turn provides a higher confinement energy at the edges of the well, reducing the parallel electron transport in the adjacent buffer and donor layers.

The dislocations associated with the relaxation of the channel layer 22 do not contribute to lowered device performance because their spacings are large compared to the device size, and because they are oriented in only one direction. If the well width is increased beyond the partial relaxation, dislocations form in two directions and impede electron transport in the device, yielding lowered performance.

Figure 4:
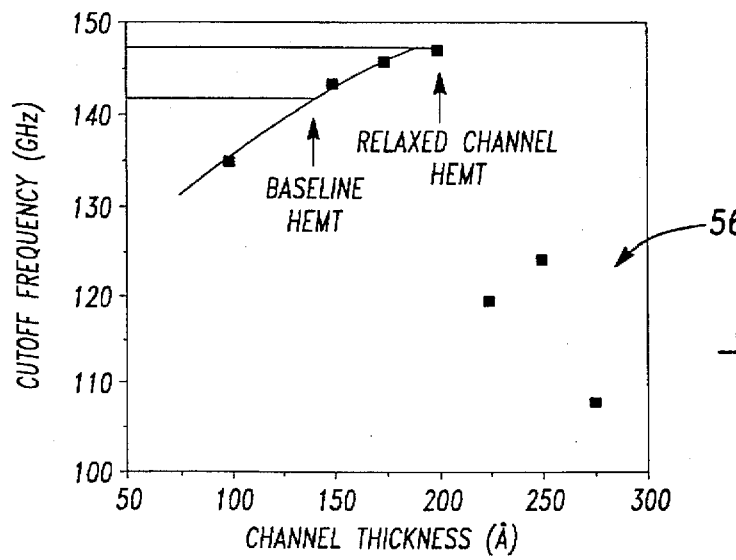
FIG. 4 is a graph showing channel thickness on the horizontal axis and cutoff frequency $f_c$ on the vertical axis to show the cutoff frequency of the InGaAs channel layer of the HEMT of FIG. 1.

FIG. 4 shows a graph of channel thickness on the horizontal axis and cut-off frequency $f_c$ in GHz on the vertical axis. The cut-off frequency defines the maximum device performance. As is apparent from this graph, the relaxed channel HEMT 10 of the present invention has a higher cut-off frequency at a 200 Å channel layer thickness as compared to known base line HEMTs having a channel layer thickness at 150 Å. A series of three data points, generally indicated at 56, shows the degradation of device performance at thicknesses greater than 200 Å for a channel layer having a percentage of indium at 30% or below. Therefore, for a InGaAs channel of this type, dislocations in more than one direction occur at a channel thickness greater than 200 Å, resulting in poor device performance.

The foregoing discussion discloses and describes merely exemplary embodiments of the present invention. One skilled in the art will readily recognize from such discussion, and from the accompanying drawings and claims, that various changes, modifications, and variations can be made therein without departing from the spirit and scope of the invention as defined in the following claims.

What is claimed is:

1. A semiconductor device including a plurality of semiconductor layers, said device comprising:
    a substrate layer;
    a first semiconductor layer being supported on the substrate layer;
    a second semiconductor layer being supported on the substrate; and
    a channel layer being supported on the substrate layer and being positioned between the first and second semiconductor layers, wherein a conduction band of the first and second semiconductor layers and a conduction band of the channel layer define a potential well in the channel layer for electron transport, said channel layer being a partially relaxed channel layer including crystal lattice dislocations formed substantially in a single direction.

2. The semiconductor device according to claim 1 wherein the channel layer is an InGaAs channel layer having a thickness greater than 150 Å.

3. The semiconductor device according to claim 1 wherein the channel layer is an InGaAs channel layer having a concentration of indium below 30%.

4. The semiconductor device according to claim 1 wherein the first semiconductor layer is an AlGaAs buffer layer positioned on the substrate between the substrate and the channel layer, and the second semiconductor layer is an AlGaAs donor layer positioned on the channel layer opposite to the substrate.

5. The semiconductor device according to claim 1 wherein the semiconductor device is a high electron mobility transistor, the channel layer is an InGaAs channel layer having a thickness in the range of about 150 Å to about 200 Å and a concentration of indium below 30%, the first semiconductor layer is an AlGaAs buffer layer, and the second semiconductor layer is an AlGaAs donor layer.

6. The semiconductor device according to claim 1 further comprising first and second planar doped layers positioned on each side of the channel layer, said doped layers including silicon atoms.

7. The semiconductor device according to claim 1 wherein the substrate layer is made of a semiconductor material selected from the group consisting of GaAs and InP.

8. A high electron mobility transistor (HEMT) including a plurality of semiconductor layers, said HEMT comprising:
    a substrate layer;
    an AlGaAs buffer layer being supported on the substrate;
    an AlGaAs donor layer being supported on the substrate layer; and
    an InGaAs channel layer supported on the substrate layer between the buffer layer and the donor layer, wherein a conduction band of the buffer layer, a conduction band of the donor layer and a conduction band of the channel layer define a potential well in the channel layer for electron transport, said channel layer being a partially relaxed channel layer including crystal lattice dislocations formed substantially in a single direction.

9. The HEMT according to claim 8 wherein the InGaAs channel layer has a concentration of indium atoms below 30% and a thickness between 150 Å and 200 Å.

10. The HEMT according to claim 8 further comprising a first doped layer and a second doped layer, said first doped layer being positioned between the buffer layer and the channel layer and the second doped layer being positioned between the channel layer and the donor layer, said doped layers being silicon atom layers.

11. The HEMT according to claim 8 wherein the substrate layer is made of a semiconductor material selected from the group consisting of GaAs and InP.

12. A method of producing a semiconductor device, said method comprising the steps of:

providing a substrate layer;

depositing a first semiconductor layer on the substrate in a crystalline format;

depositing a second semiconductor layer on the substrate layer in a crystalline format; and depositing a channel layer on the substrate layer between the first and second semiconductor layers in a crystalline format, wherein a conduction band of the first and second semiconductor layers and a conduction band of the channel layer define a potential well in the channel layer for electron transport, said channel layer having crystal lattice dislocations formed substantially in a single direction so as to be a partially relaxed channel layer.

13. The method according to claim 12 wherein the step of depositing a channel layer includes depositing an InGaAs channel layer to a thickness greater than 150 Å.

14. The method according to claim 12 wherein the step of depositing a channel layer includes depositing an InGaAs channel layer having a concentration of indium below 30%.

15. The method according to claim 12 wherein the step of providing a substrate layer includes providing a substrate layer made of a semiconductor material selected from the group consisting of GaAs and InP.

* * * * *